(12) United States Patent
Yoon et al.

(10) Patent No.: US 9,406,635 B2
(45) Date of Patent: Aug. 2, 2016

(54) SEMICONDUCTOR LIGHT EMITTING DEVICE AND SEMICONDUCTOR LIGHT EMITTING DEVICE PACKAGE USING THE SAME

(71) Applicant: SAMSUNG ELECTRONICS CO., LTD., Suwon-si, Gyeonggi-do (KR)

(72) Inventors: Ju Heon Yoon, Seoul (KR); Yong Il Kim, Seoul (KR); Myong Soo Cho, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/693,749

(22) Filed: Apr. 22, 2015

(65) Prior Publication Data
US 2016/0056118 A1    Feb. 25, 2016

(30) Foreign Application Priority Data

Aug. 20, 2014    (KR) .......................... 10-2014-0108440

(51) Int. Cl.
*H01L 23/00* (2006.01)
*H01L 33/62* (2010.01)
(52) U.S. Cl.
CPC .............. *H01L 24/16* (2013.01); *H01L 33/62* (2013.01); *H01L 2224/1607* (2013.01); *H01L 2224/16106* (2013.01); *H01L 2924/3512* (2013.01)

(58) Field of Classification Search
None
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |

(Continued)

*Primary Examiner* — Joseph Schoenholtz
(74) *Attorney, Agent, or Firm* — Lee & Morse, P.C.

(57) ABSTRACT

A semiconductor light emitting device includes a multi-region solder pad. The semiconductor light emitting device includes a light emitting diode (LED) chip having a first surface on which first and second electrodes are disposed and a second surface opposing the first surface. A passivation layer is disposed on a surface of the LED chip such that bonding regions of the first and second electrodes are exposed through the passivation layer. A solder pad is disposed in each respective bonding region and has a plurality of separated regions. A solder bump is disposed in each respective bonding region and covers the plurality of separated regions of the respective solder pad. In the semiconductor light emitting device, separation between the solder pad and the solder bump may thereby be effectively prevented by ensuring that an interface between a solder pad and a solder bump is not entirely damaged.

20 Claims, 20 Drawing Sheets

(56) References Cited

U.S. PATENT DOCUMENTS

| | | |
|---|---|---|
| 7,964,881 B2 | 6/2011 | Choi et al. |
| 7,985,671 B2 | 7/2011 | Daubenspeck et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,124,520 B2 | 2/2012 | Kim et al. |
| 8,129,711 B2 | 3/2012 | Kang et al. |
| 8,179,938 B2 | 5/2012 | Kim |
| 8,232,643 B2 | 7/2012 | Chuang et al. |
| 8,263,987 B2 | 9/2012 | Choi et al. |
| 8,299,616 B2 | 10/2012 | Chuang et al. |
| 8,304,915 B2 | 11/2012 | Mori et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,546,945 B2 | 10/2013 | Kuo et al. |
| 8,569,897 B2 | 10/2013 | Liu et al. |
| 8,581,420 B2 | 11/2013 | Tsai et al. |
| 8,735,931 B2 | 5/2014 | Han et al. |
| 8,766,295 B2 | 7/2014 | Kim |
| 9,184,357 B2 * | 11/2015 | Sugizaki ................ H01L 33/44 |
| 2005/0067699 A1 | 3/2005 | Leong et al. |
| 2007/0111500 A1 * | 5/2007 | Cowens ............. H01L 21/4853 |
| | | 438/612 |
| 2010/0207271 A1 | 8/2010 | Omi |
| 2011/0121445 A1 | 5/2011 | Mori et al. |
| 2012/0094407 A1 * | 4/2012 | Wang ................... H01L 23/544 |
| | | 438/27 |
| 2012/0273935 A1 | 11/2012 | Martens et al. |
| 2013/0032941 A1 | 2/2013 | Topacio et al. |
| 2013/0092962 A1 * | 4/2013 | Paek ...................... H01L 33/62 |
| | | 257/88 |
| 2013/0187277 A1 | 7/2013 | Chen et al. |
| 2013/0286594 A1 | 10/2013 | Onai et al. |

\* cited by examiner

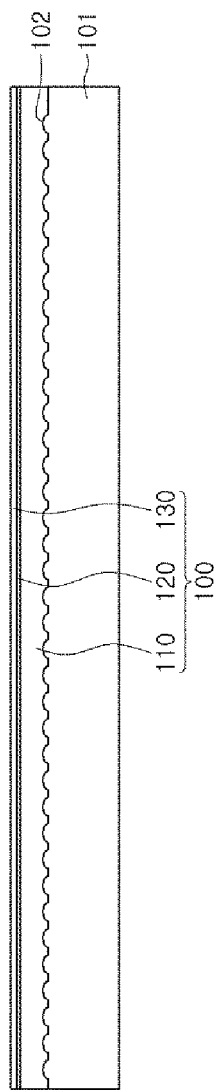

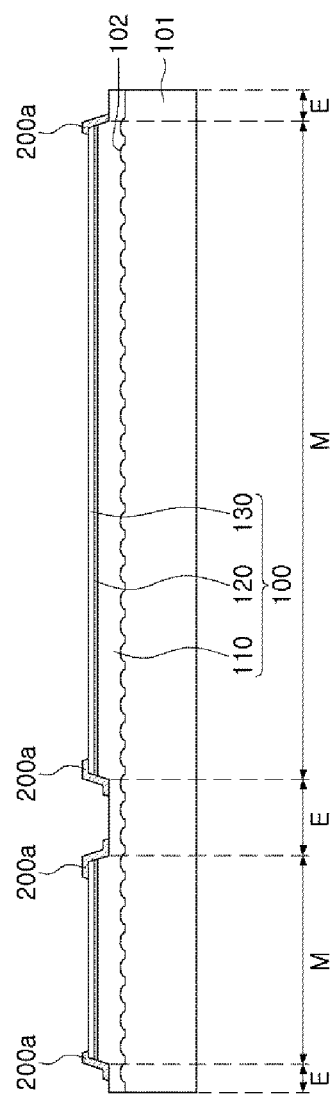

SEMICONDUCTOR LIGHT EMITTING DEVICE AND SEMICONDUCTOR LIGHT EMITTING DEVICE PACKAGE USING THE SAME

CROSS-REFERENCE TO RELATED APPLICATION

This application claims the benefit of Korean Patent Application No. 10-2014-0108440 filed on Aug. 20, 2014, with the Korean Intellectual Property Office, the disclosure of which is incorporated herein by reference.

TECHNICAL FIELD

The present disclosure relates to a semiconductor light emitting device and a semiconductor light emitting device package using the same.

BACKGROUND

Light emitting diodes (LEDs) have advantages such as long lifespans, low power consumption, fast response speeds, environmental friendliness, and the like, as compared to related art light sources. LEDs are considered to be next generation light sources, and have come to prominence as being important light sources in various products such as lighting devices and the backlights of display devices.

Among LEDs, a flipchip type LED uses an alloy containing a relatively high-priced metal alloy, such as AuSn or the like, as a bonding metal, thereby increasing costs. Moreover, since the metal alloy is melted at relatively high temperatures, a relatively high-priced package is used that is formed of a material having a coefficient of thermal expansion appropriate for high temperature bonding conditions and which is not deformed at high temperatures, thereby reducing utilization coverage.

Also, an interface between a solder pad and a solder bump may be easily damaged, leading to separation of the solder pad and a solder bump.

SUMMARY

Exemplary embodiments described in the present disclosure may provide methods and structures for preventing the occurrence of damage in an interface between a solder pad and a solder bump and preventing separation of the solder pad and the solder bump.

According to an exemplary embodiment in the present disclosure, a semiconductor light emitting device may include a light emitting diode (LED) chip, a passivation layer, a plurality of solder pads, and a plurality of solder bumps. The LED chip has a first surface on which first and second electrodes are disposed and a second surface opposing the first surface. The passivation layer is disposed on a surface of the LED chip such that bonding regions of the first and second electrodes are exposed through the passivation layer. Each solder pad of the plurality of solder pads is disposed in a respective bonding region of the bonding regions and has a plurality of separated regions. Each solder bump of the plurality of solder bumps is disposed in a respective bonding region of the bonding regions and covers the plurality of separated regions of the solder pad disposed in the respective bonding region.

The plurality of separated regions of each solder pad may be separated and spaced part from each other by an isolation region forming a predetermined gap between the separated regions.

A width of the isolation region may be smaller than a width of one of the plurality of separated regions.

The isolation region may have a band shape surrounding one of the plurality of separated regions of the solder pads.

A crack blocking layer may be disposed in each isolation region.

The crack blocking layer may have a material composition that is the same as the material composition of the passivation layer.

The crack blocking layer may include an insulating material including at least one of $SiO_2$, SiN, $SiO_xN_y$, $TiO_2$, $Si_3N_4$, $Al_2O_3$, TiN, AlN, $ZrO_2$, TiAlN and TiSiN.

An inter-metallic compound layer may be disposed on a surface of each solder pad with which a solder bump is in contact.

The inter-metallic compound layer may include separated regions each corresponding to one of the plurality of separated regions of each solder pad.

The inter-metallic compound layer may be formed of an Sn—Ni alloy.

A barrier metal layer may be disposed between the solder pads and the first and second electrodes.

An insulating layer, having openings partially exposing the first and second electrodes, may be disposed between the barrier metal layer and the first and second electrodes.

According to another exemplary embodiment in the present disclosure, a semiconductor light emitting device package may include a package body including first and second lead frames, and a semiconductor light emitting device connected to the first and second lead frames through solder bumps interposed between the semiconductor light emitting device and the first and second lead frames of the package body. The semiconductor light emitting device may include: a light emitting structure including a first conductivity-type semiconductor layer, an active layer, and a second conductivity-type semiconductor layer; and a solder pad electrically connected to one of the first and second conductivity-type semiconductor layers and disposed in a bonding region. The bonding region may have an area recessed from the circumference thereof that is free of the solder pad, and one of the solder bumps may be disposed in the bonding region to cover the solder pad and the area recessed from the circumference.

A crack blocking layer may be disposed in the recessed area.

An inter-metallic compound layer may be formed on a surface of the solder pad with which the solder bump is in contact.

According to a further exemplary embodiment in the present disclosure, an integrated circuit chip may include a substrate, at least one electronic component disposed on the substrate, and a solder pad disposed on the substrate. The solder pad may include a first solder pad region configured for soldering to a solder bump, and a second solder pad region spaced apart from the first solder pad and configured for soldering to the same solder bump as the first solder pad region.

The integrated circuit chip may further include an insulating material layer disposed in a space between the first and second solder pads.

The integrated circuit chip may further include a passivation layer surrounding the solder pad, wherein the passivation layer and the insulating material layer may be formed of a same insulating material.

The integrated circuit chip may further include an insulating layer overlaying the at least one electronic component.

The solder pad may be disposed on a portion of the insulating layer overlaying the at least one electronic component.

A circumferential edge of the first solder pad region may include a concave portion.

BRIEF DESCRIPTION OF DRAWINGS

The above and other aspects, features and other advantages in the present disclosure will be more clearly understood from the following detailed description taken in conjunction with the accompanying drawings, in which:

FIGS. 5A, 5B, 6A, 6B, 7A, 7B, 8A, 8B, 9A, 9B, 10A, and 10B are views schematically illustrating a process of manufacturing the semiconductor light emitting device of FIG. 1;

DETAILED DESCRIPTION

Figure 1:
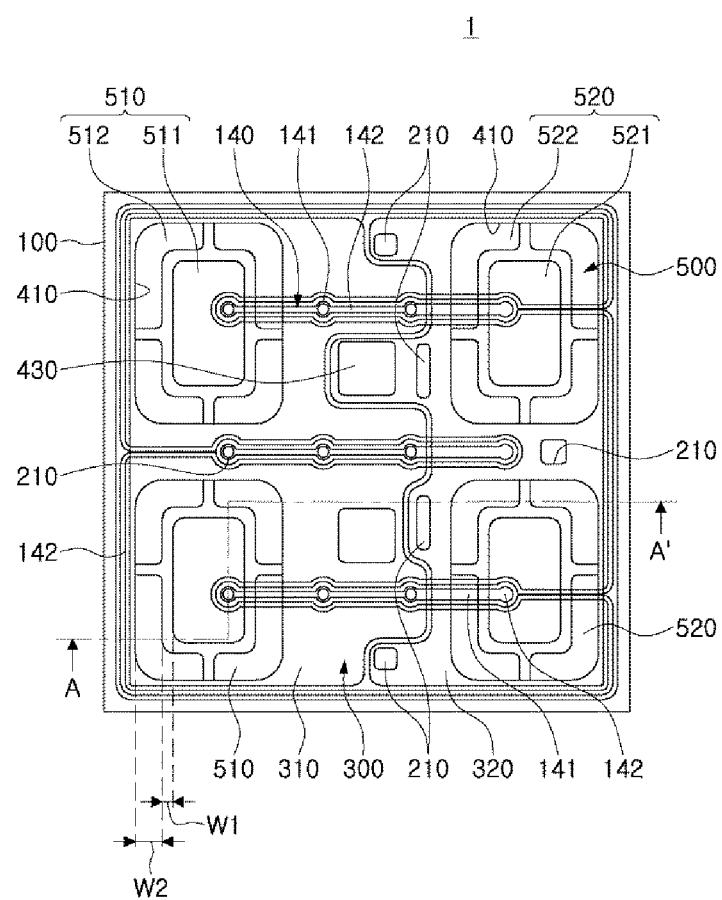
FIG. 1 is a plan view schematically illustrating a semiconductor light emitting device according to an exemplary embodiment in the present disclosure.

Hereinafter, exemplary embodiments in the present disclosure will be described in detail with reference to the accompanying drawings. The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

In the present disclosure, terms such as 'above', 'upper portion', 'upper surface', 'below', 'lower portion', 'lower surface', or 'lateral surface' indicate positions determined based on the particular orientations shown in the drawings. However, the terms should be understood to more broadly refer to relative positions of various elements, and may thus be changed according to directions or orientations in which a device or a package is disposed.

A semiconductor light emitting device package according to an exemplary embodiment will be described with reference to FIGS. 1 through 3. FIG. 1 is a plan view schematically illustrating a semiconductor light emitting device according to an exemplary embodiment in the present disclosure, FIG. 2 is a cross-sectional view of the semiconductor light emitting device of FIG. 1 taken along line A-A', and FIG. 3 is an enlarged cross-sectional view of portion 'B' of FIG. 2.

Figure 2:
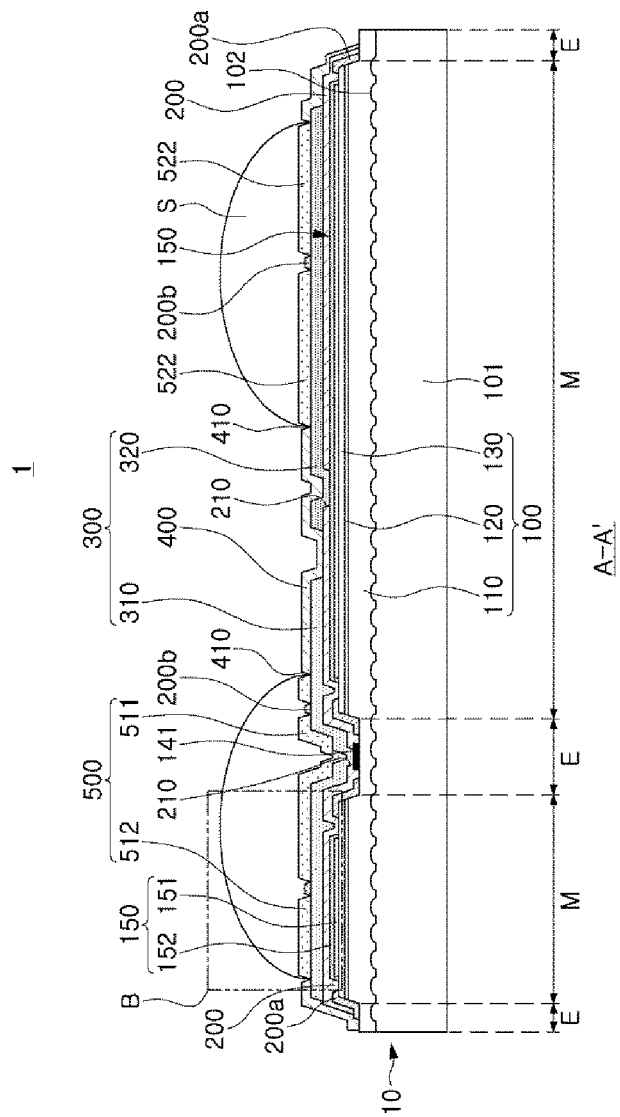
FIG. 2 is a cross-sectional view of the semiconductor light emitting device of FIG. 1 taken along line A-A'.
Figure 3:
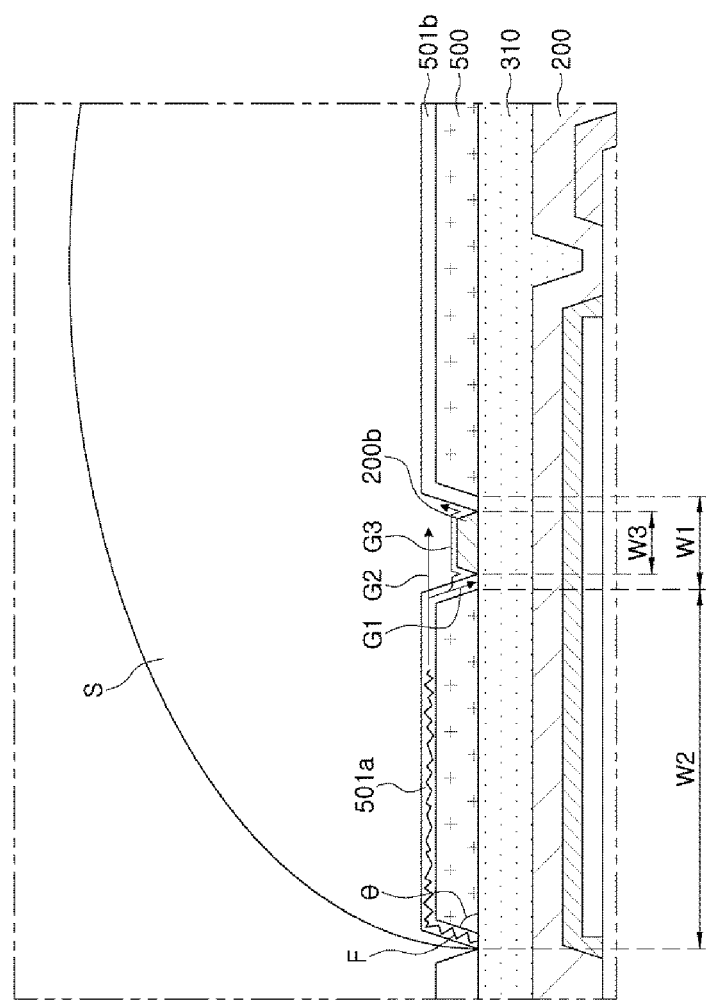
FIG. 3 is an enlarged cross-sectional view of portion 'B' of FIG. 2.

Referring to FIGS. 1 through 3, a semiconductor light emitting device 1 according to the present exemplary embodiment may include a light emitting diode (LED) chip 10, a passivation layer 400, a solder pad 500, and a solder bump S.

The LED chip 10 may include a light emitting structure 100 and first and second electrodes 140 and 150 and may have a first surface on which the first and second electrodes 140 and 150 are disposed and a second surface opposing the first surface.

The light emitting structure 100 may have a structure in which a plurality of semiconductor layers are stacked, and may include a first conductivity-type semiconductor layer 110, an active layer 120, and a second conductivity-type semiconductor layer 130 sequentially stacked on a substrate 101.

The substrate 101 may have an upper surface extending in x and y directions. The substrate 101 may be provided as a semiconductor growth substrate and may be formed of an insulating, a conductive, or a semiconductive material such as sapphire, silicon (Si), SiC, $MgA_{12}O_4$, MgO, $LiAlO_2$, $LiGaO_2$, or GaN. Sapphire commonly used as a material of a nitride semiconductor growth substrate is a crystal having electrical insulating properties, having Hexa-Rhombo R3c symmetry, and having a lattice constant of 13,001 Å along a c-axis and a lattice constant of 4,757 Å along an a-axis. Sapphire has a C (0001) plane, an A (11-20) plane, and an R (1-102) plane. In this case, the C plane is mainly used as a nitride growth substrate because it facilitates the growth of a nitride thin film and is stable at high temperatures.

As illustrated, a plurality of depression and protrusion patterns 102 may be formed on an upper surface of the substrate 101, namely, on a growth surface of the semiconductor layers, and crystallinity, light emitting efficiency, and the like, of the semiconductor layers may be enhanced by the depression and protrusion patterns 102. In the present exemplary embodiment, the depression and protrusion patterns 102 are illustrated as having a dome-like convex shape, but shapes of the depression and protrusion patterns 102 are not limited thereto. For example, the depression and protrusion patterns 102 may have various shapes such as a quadrangular shape, a triangular shape, and the like. Also, the depression and protrusion patterns 102 may be selectively formed and provided, and may be omitted according to exemplary embodiments.

The substrate 101 may be removed according to exemplary embodiments. Namely, after the substrate 101 is provided as a growth substrate for growing the first conductivity-type semiconductor layer 110, the active layer 120, and the second conductivity-type semiconductor layer 130, the substrate 101 may be removed from the light emitting structure 100 through a separation process. In this case, the substrate 101 may be separated from the semiconductor layers through a laser lift-off (LLO) process, a chemical lift-off (CLO) process, and the like.

Although not shown, a buffer layer may be formed on an upper surface of the substrate 101. The buffer layer, serving to alleviate lattice defects in the semiconductor layers grown on the substrate 101, may be formed as an undoped semiconductor layer formed of a nitride, or the like. For example, the buffer layer may alleviate a difference in lattice constants between the sapphire substrate 101 and the first conductivity-type semiconductor layer 110 formed of GaN and stacked thereon to increase crystallinity of the GaN layer. In this case, undoped GaN, AlN, InGaN, and the like, may be applied as the buffer layer, and the buffer layer may be grown to have a thickness ranging from tens to hundreds of Å at low temperatures ranging from 500° C. to 600° C. Here, undoping refers to not performing an impurity doping process on a semiconductor layer. The semiconductor layer may have an inherent level of impurity concentration. For example, when a gallium nitride semiconductor is grown by using a metal organic chemical vapor deposition (MOCVD) process, silicon (Si), or the like, used as a dopant, may be included in an amount ranging from about $10^{14}$ to $10^{18}/cm^3$ therein, although not intentionally. Here, the buffer layer is not essential in the present exemplary embodiment and may be omitted according to exemplary embodiments.

The first conductivity-type semiconductor layer 110 stacked on the substrate 101 may be formed of a semiconductor doped with an n-type impurity and may be an n-type nitride semiconductor layer. Also, the second conductivity-type semiconductor layer 130 may be formed of a semiconductor doped with a p-type impurity and may be a p-type nitride semiconductor layer. However, according to exemplary embodiments, the first and second conductivity-type semiconductor layers 110 and 130 may be interchanged in terms of position so as to be stacked. The first and second conductivity-type semiconductor layers 110 and 130 may have an empirical formula $Al_xIn_yGa_{(1-x-y)}N$, where, $0 \le x < 1$, $0 \le y < 1$, and $0 \le x+y < 1$, and for example, materials such as GaN, AlGaN, InGaN, or AlInGaN may correspond thereto.

The active layer 120 disposed between the first and second conductivity-type semiconductor layers 110 and 130 may emit light having a predetermined level of energy through electron-hole recombination. The active layer 120 may include a material having an energy band gap smaller than those of the first and second conductivity-type semiconductor layers 110 and 130. For example, in a case in which the first and second conductivity-type semiconductor layers 110 and 130 are formed of a GaN-based compound semiconductor, the active layer 120 may include an InGaN-based compound semiconductor having an energy band gap smaller than that of GaN. Also, the active layer 120 may have a multi-quantum well (MQW) structure in which quantum well layers and quantum barrier layers are alternately stacked. The active layer 120 may have an empirical formula $In_xGa_{1-x}N$, where, $0 \le x \le 1$ and for example, materials such as InGaN/GaN correspond thereto. However, without being limited thereto, the active layer 120 may have a single quantum well (SQW) structure.

The light emitting structure 100 may include an etched region E in which portions of the second conductivity-type semiconductor layer 130, the active layer 120, and the first conductivity-type semiconductor layer 110 are etched, and a plurality of mesa regions M partially demarcated by the etched region E.

The etched region E may have a gap structure removed from one side of the light emitting structure 100 having a quadrangular shape to the other side of the light emitting structure 100 opposed thereto to have a predetermined thickness and length, and a plurality of etched regions E may be arranged to be parallel with each other on an inner side of the quadrangular region of the light emitting structure 100. Thus, the plurality of etched regions E may be surrounded by the mesa regions M.

A first electrode 140 may be disposed on an upper surface of the first conductivity-type semiconductor layer 110 exposed to the etched region E, and connected to the first conductivity-type semiconductor layer 110. A second electrode 150 may be disposed on an upper surface of each of the plurality of mesa regions M and connected to the second conductivity-type semiconductor layer 130. The first and second electrodes 140 and 150 may be disposed on the first surface of the LED chip 10 on which the light emitting structure 100 is positioned. Thus, the first and second electrodes 140 and 150 may be disposed to be coplanar in the LED chip 10 and mounted on a package body 1002 as described hereinafter in a flip-chip manner.

As illustrated in FIG. 1, the first electrode 140 may include a plurality of pad portions 141 and a plurality of finger portions 142. The finger portions 142 may have a width smaller than that of the pad portions 141 and may extend from the plurality of pad portions 141, along the etched regions E. A plurality of first electrodes 140 may be arranged to be spaced apart from one another so as to be evenly distributed on the entirety of first conductivity-type semiconductor layer 110. Thus, a current injected to the first conductivity-type semiconductor layer 110 may be evenly injected to the entirety of the first conductivity-type semiconductor layer 110 through the plurality of first electrodes 140.

The plurality of pad portions 141 may be disposed to be spaced apart from one another, and the plurality of finger portions 142 may connect the plurality of pad portions 141. The plurality of finger portions 142 may have different widths. For example, when the first electrode 140 has three finger portions 142 as in the present exemplary embodiment, a width of any one finger portion 142 may be greater than those of the other finger portions 142. The width of the any one finger portion 142 may be adjusted in consideration of resistance to a current injected through the first electrode 140.

The second electrode 150 may include a reflective metal layer 151. Also, the second electrode 150 may further include a coating metal layer 152 covering the reflective metal layer 151. However, the coating metal layer 152 may be selectively provided and may be omitted according to exemplary embodiments. The second electrode 150 may cover an upper surface of the second conductivity-type semiconductor layer 130 defining an upper surface of the mesa region M.

In order to cover the active layer 120 exposed to the etched region E, a first insulating layer 200a formed of an insulating material may be provided on at least a portion of the light emitting structure 100 including a lateral surface the mesa region M. For example, the first insulating layer 200a may be formed of an insulating material such as $SiO_2$, SiN, $SiO_xN_y$, $TiO_2$, $Si_3N_4$, $Al_2O_3$, TiN, AlN, $ZrO_2$, TiAlN, or TiSiN. Also, the first insulating layer 200a may be provided such that it exposes the first and second electrodes 140 and 150. However, the first insulating layer 200a is selectively provided and may be omitted according to exemplary embodiments.

A second insulating layer 200 may be formed on the light emitting structure 100 and cover the entirety of light emitting structure 100. The second insulating layer 200 may be formed of a material having insulating properties, and may be formed of an inorganic material or an organic material. For example, the second insulating layer 200 may be formed of an epoxy-based insulating resin. Also, the second insulating layer 200 may include a silicon oxide or a silicon nitride and may be formed of, for example, $SiO_2$, SiN, $SiO_xN_y$, $TiO_2$, $Si_3N_4$, $Al_2O_3$, TiN, AlN, $ZrO_2$, TiAlN, or TiSiN.

The second insulating layer 200 may include a plurality of openings 210 disposed on the first electrode 140 and the second electrode 150. In detail, the plurality of openings 210 may be provided in positions corresponding to the first electrode 140 and the second electrode 150, respectively, and partially expose the first electrode 140 and the second electrode 150 corresponding thereto.

In particular, among the plurality of openings 210, the opening 210 disposed on the first electrode 140 may only outwardly expose the pad portion 141 of the first electrode 140. Thus, the plurality of openings 210 may be disposed in positions corresponding to the pad portion on the first electrode 140.

The barrier metal layer 300 is provided on the second insulating layer 200, and may be electrically connected to the first conductivity-type semiconductor 110 and the second conductivity-type semiconductor layer 130 through the plurality of openings 210, respectively.

As illustrated in FIG. 2, the barrier metal layer 300 may be insulated from the first and second conductivity-type semiconductor layers 110 and 130 by the second insulating layer 200 covering the entirety of an upper surface of the light emitting structure 100. The barrier metal layer 300 may be connected to the pad portions 141 and the second electrode 150 partially exposed through the plurality of openings 210 so as to be electrically connected to the first and second conductivity-type semiconductor layers 110 and 130.

Electrical connections between the barrier metal layer 300 and the first and second conductivity-type semiconductor layers 110 and 130 may be variously adjusted by the plurality of openings 210 provided in the second insulating layer 200. For example, electrical connections between the barrier metal layer 300 and the first and second conductivity-type semiconductor layers 110 and 130 may be variously modified according to the number and dispositional positions of the plurality of openings 210.

The barrier metal layer 300 may be provided as at least a pair of metal layers including a first metal layer 310 and a second metal layer 320. Namely, the first metal layer 310 may be electrically connected to the first conductivity-type semiconductor layer 110 through the pad portions 141 of the first electrode 140. The second metal layer 320 may be electrically connected to the second conductivity-type semiconductor layer 130 through the second electrode. In this case, the opening 210 exposing the first electrode 140 may need to be disposed in a position in which the opening overlaps with the first metal layer 310, and the opening 210 exposing the second electrode 150 may need to be disposed in a position in which the opening 210 overlaps with the second metal layer 320. The first and second metal layers 310 and 320 may be separated and electrically insulated from each other.

The barrier metal layer 300 may be formed of a material including one or more among gold (Au), tungsten (W), platinum (Pt), silicon (Si), iridium (Ir), silver (Ag), copper (Cu), nickel (Ni), titanium (Ti), chromium (Cr), and alloys thereof, for example.

Among the first electrodes 140, the first electrode 140 disposed in a position in which the second metal layer 320 is positioned thereabove, thus overlapping with the second metal layer 320, may need to be prevented from being electrically connected to the second metal layer 320. To this end, the second insulating layer 200 may not have the opening 210 exposing the pad portion 141 of the first electrode 140, in the portion where the second metal layer 320 is positioned thereabove.

In detail, as illustrated in FIG. 1, in the case in which the first electrode 140 includes four pad portions 141 and three finger portions 142, the openings 210 exposing the pad portions 141 may be provided only on the three pad portions 141 disposed in locations where the three pad portions 141 overlap with the first metal layer 310 and may not be provided on the other remaining pad portion 141 disposed in a location in which the pad portion 141 overlaps with the second metal layer 320. Thus, the pad portion 141 of the first electrode 140 positioned below the first metal layer 310 may be connected to the first metal layer 310 through the opening 210, but since the opening 210 is not provided on the pad portion 141 positioned below the second metal layer 320, the pad portion 141 and the second metal layer 320 may be electrically insulated from one another. As a result, through the arrangement structure of the plurality of openings 210 respectively exposing the first electrode 140 and the second electrode 150, the first metal layer 310 may be connected to the first electrode 140 and the second metal layer 320 may be connected to the second electrode 150.

The passivation layer 400 is provided on the barrier metal layer 300 and covers the entirety of the barrier metal layer 300. The passivation layer 400 may include a bonding region 410 partially exposing the barrier metal layer 300.

A plurality of bonding regions 410 may be provided to partially expose the first metal layer 310 and the second metal layer 320. In this case, a portion of the plurality of bonding regions 410 may be disposed not to overlap with a portion of the plurality of openings 210 of the second insulating layer 200. For example, as illustrated in FIG. 2, among the plurality of bonding regions 410, the bonding region 410 partially exposing the second metal layer 320 may not overlap with the opening 210 partially exposing the second electrode 150, among the plurality of openings 210. Namely, the bonding region 410 is not positioned above the opening 210 in a vertical direction. The bonding region 410 partially exposing the first metal layer 310 may partially overlap with the opening 210 partially exposing the first electrode 140.

In the present exemplary embodiment, it is illustrated that four bonding regions 410 are symmetrically disposed, but the number and dispositional form and pattern of the bonding regions 410 are not limited thereto and may be variously modified.

The passivation layer 400 may be formed of the same material as that of the second insulating layer 200.

The passivation layer 400 may further include open regions 430 partially exposing the first and second metal layers 310 and 320, like the bonding regions 410. The open regions 430 may be provided as regions connected to a probe pin (not shown) in order to determine whether the semiconductor light emitting device is operable before being mounted.

The solder pads 500 are disposed in the bonding regions 410, respectively, and may have a plurality of separated regions.

The solder pads 500 may include a first solder pad 510 and a second solder pad 520 that may be respectively connected to the first and second metal layers 310 and 320 partially exposed through the bonding regions 410. The solder pads may be electrically connected to the first conductivity-type semiconductor layer 110 and the second conductivity-type semiconductor layer 130 through the barrier metal layer 300. The solder pads 500 may be formed of a material including one or more among materials such as nickel (Ni), gold (Au), or copper (Cu), and alloys thereof. Also, the solder pads 500 may have sides which are substantially vertical. However, the solder pads 500 may not have such vertical sides, and as illustrated in FIG. 3, the side of the solder pad 500 may have a predetermined slope angle (θ).

The first solder pad 510 and the second solder pad 520 may be, for example, under-bump metallurgy (UBM) layers. The first solder pad 510 and the second solder pad 520 may each be provided as an individual electrode or as a plurality of electrodes. In the present exemplary embodiment, it is illustrated that two first solder pads 510 and two second solder pads 520 are provided, but the total number of first solder pads 510 and second solder pads 520 is not limited thereto. The number and dispositional structure or pattern of the first solder pads 510 and the second solder pads 520 may be adjusted according to the number, shape, and pattern of bonding regions 410.

Solder bumps S may be disposed on the first and second solder pads 510 and 520. The solder bumps S may use an Sn solder as a conductive adhesive for mounting the LED chip 10 on a package board in a flip-chip manner. The Sn solder may contain a small amount of material such as silver (Ag) or copper (Cu).

In this manner, the solder bumps S may be disposed on the solder pad 500 and used to mount the LED chip 10 on a package board during a follow-up process.

However, when the solder bump S is disposed on the solder pad 500, the materials of the solder pad 500 and the solder bump S react with each other to form an inter-metallic compound layer 501a on a surface of the solder pad 500 with which the solder bump S is in contact as illustrated in FIG. 3. For example, the inter-metallic compound layer may be an Sn—Ni alloy.

The inter-metal compound layer 501a may have characteristics that it has a modulus of elasticity smaller than that of the material forming the solder bump S and brittleness greater than that of the material forming the solder bump S. Thus, after the solder bump S is disposed on the solder pad 500, when an external impact is applied during a follow-up process, cracks F may be easily generated in the inter-metallic compound layer 501a. Although the cracks F may start from a region of the inter-metallic compound layer 501a, the cracks F commonly propagate to the entire region of the inter-metallic compound layer 501a along the inter-metallic compound layer 501a. Propagation of the cracks F to the entire region of the inter-metallic compound layer 501a may cause an open defect in which the solder bump S is completely separated from the solder pad 500.

In particular, the cracks F may be directly transmitted to the side of the inter-metallic compound layer 501a, and thus, the side may be easily cracked.

In the present exemplary embodiment, in order to prevent the cracks F generated from a region of the inter-metallic compound layer 501a from propagating to the entire region of the inter-metallic compound layer 501a, each solder pad 500/510/520 in contact with the solder bump S is divided into a plurality of regions (e.g., 511, 512, 522, and 521). When the solder pad 500 is divided into a plurality of regions, propagation of cracks generated from a region of the inter-metallic compound layer 501a to the entire region of the inter-metallic compound layer 501a may be effectively prevented. Thus, an open defect in which the solder bump S is completely separated from the solder pad 500 may be prevented in advance.

In detail, the solder pad 500 may be disposed to have a plurality of separated regions 511, 512, 522, and 521. For example, as illustrated in FIG. 1, the first solder pad 510 may include a central portion 511 and a plurality of peripheral portions 512 surrounding the central portion 511. Portions 511 and 512 may be configured for soldering to a same solder bump. The second solder pad 510 may also include a central portion 521 and a plurality of peripheral portions 522 surrounding the central portion 521. Portions 521 and 522 may be configured for soldering to a same solder bump that is different from the solder bump soldered to regions 511 and 512. The peripheral portion 512 may have a predetermined width W2 (e.g., a width measured orthogonally to an outer edge of the central portion 511) and may be disposed to be spaced apart from the central portion 511 by a predetermined isolation region W1. The isolation region W1 may not necessarily be disposed to have a uniform width but may be disposed to have at least a space by which the inter-metallic compound layers 501a and 501b formed on adjacent separated regions of the solder pad 500 are not in contact with each other. However, the separated regions of the solder pad 500 may not need to be completely isolated regions and may be disposed to have a region recessed from the circumference of the solder pad 500 (see, e.g., FIGS. 4B and 4D).

The isolation region W1 may be narrower than the width W2 of the peripheral portion 512. The area of the isolation region W1 may be 70% or less of the area of the solder pads 510 and 520.

As illustrated in FIG. 3, a crack blocking layer 200b may be disposed in the isolation region W1 in order to more effectively block propagation of cracks F. The crack blocking layer 200b may be formed of an insulating material such as $SiO_2$, SiN, $SiO_xN_y$, $TiO_2$, $Si_3N_4$, $Al_2O_3$, TiN, AlN, $ZrO_2$, TiAlN, or TiSiN, and may be formed of a material having the same composition as that of the passivation layer 400. The crack blocking layer 200b may effectively block propagation of cracks F, and details thereof will be described hereinafter.

Figure 4A:
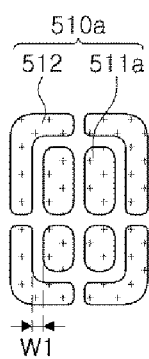
FIGS. 4A through 4D are modified examples of a solder pad of FIG. 1.
Figure 4B:
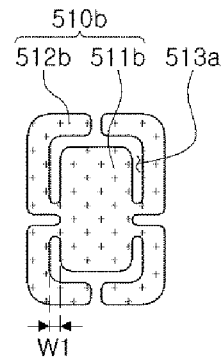
Figure 4C:
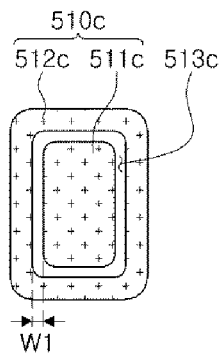
Figure 4D:
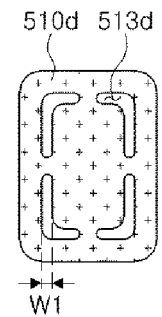

The solder pad 500 may be modified to various shapes. FIGS. 4A through 4D are modified examples of the solder pad of FIG. 1. FIG. 4A illustrates a solder pad 510a in which a central portion described above is formed as a plurality of regions 511a. FIG. 4B illustrates a solder pad 510b in which a central portion 511b is connected to peripheral portions 512b in a region. Thus, an isolation region W1 may have a region 513a recessed from the circumference of the solder pad 510b. The isolation region W1 may further have a region/area 513a that is recessed from the circumference of the bonding region in which the solder pad 510d is disposed, and in which the solder pad 510b is not disposed (e.g., the region is free of the solder pad 510b). FIG. 4C illustrates a solder pad 510c in which a peripheral portion 512c surrounds a central portion 511c. In this case, an isolation region 513c may have a band shape, and may be free of the solder pad. FIG. 4D illustrates a solder pad 510d in which isolation regions 513d are formed as openings through the solder pad 510d. In FIGS. 4A-4D, each of solder pad regions 512, 510b, 512c, and 510d include circumferential edges having concave portions. Further, in each example of FIGS. 4A-4D, an area of a smallest convex polygon circumscribing the solder pad includes the solder pad and at least one region free of the solder pad.

In this manner, when the solder pad 500 is disposed as a plurality of separated regions, even though cracks are generated in a region of the inter-metallic compound layer 501a, the cracks may propagate to only one of the separated regions of the solder pad 500, rather than to the entirety of the solder pad 500.

This will be described in detail with reference to FIG. 3. Cracks F generated in a region of the inter-metallic compound layer 501a may propagate to the inter-metallic compound layer 501a. In particular, cracks F may be easily generated on the side of the inter-metallic compound layer 501a vulnerable to impact. The cracks F may be anticipated to propagate along paths in three directions G1, G2, and G3. However, since the solder bump S has characteristics that a modulus of elasticity thereof is greater than that of the inter-metallic compound layer 501a and brittleness thereof is lower than that of inter-metallic compound layer 501a, cracks F may progress in the direction G1 toward the brittle inter-metallic compound layer 501a. Thus, cracks F only propagate in the direction G1 of the surface of the inter-metallic compound layer 501a, rather than propagating in the direction G2 through the solder bump S or in the direction G3 of the surface of the solder bump S. In the region W3 in which the solder pad 500 is not disposed, the inter-metallic compound layer 501a is not formed, and thus, cracks F propagating in the direction G1 cannot progress any further. Thus, propagation of cracks F generated in one inter-metallic compound layer 501a to a neighboring inter-metallic compound layer (501a or 501b) may be effectively prevented.

Bonding strength of a case (Ref) in which a solder pad is not separately divided and bonding strength of the present exemplary embodiment were compared through die shear test (DST). When 2.85 kg was applied to the Ref case, solder bumps were completely separated, while in the exemplary embodiment, solder bumps were separated when 3.11 kg was applied. Thus, it was confirmed that bonding strength of the solder pad structure having the separated regions in the present exemplary embodiment was 9% higher than that of the solder pad structure of the Ref case.

Also, in a case in which the crack blocking layer 200b is disposed in the isolation region W1 of the solder pad 500, the inter-metallic compound layer 501a and a neighboring inter-metallic compound layer (501a or 501b) are more reliably disconnected, propagation of cracks F may be more effectively prevented.

Hereinafter, a process of manufacturing the semiconductor light emitting device of FIG. 1 will be described. FIGS. 5A-B, 6A-B, 7A-B, 8A-B, 9A-B, and 10A-B are views schematically illustrating a process of manufacturing the semiconductor light emitting device of FIGS. 1-3. In FIGS. 5A-B, 6A-B, 7A-B, 8A-B, 9A-B, and 10A-B, the same reference numerals as those of FIGS. 1 through 4 are used to denote the same members, and thus, redundant descriptions thereof will be omitted.

Figure 5A:
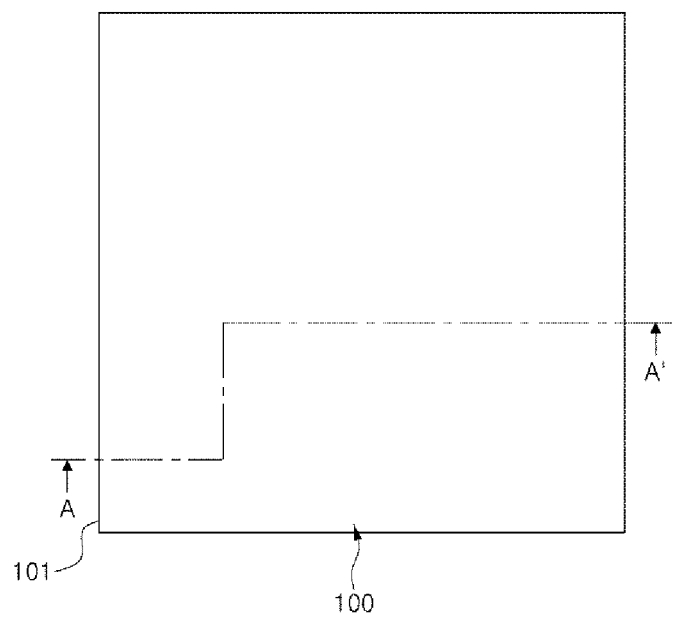

Referring to FIGS. 5A and 5B, FIG. 5A is a plan view of a light emitting structure 100 formed on a substrate 101, and FIG. 5B is a cross-sectional view taken along line A-A' of FIG. 5A. FIGS. 6A-B, 7A-B, 8A-B, 9A-B, and 10A-B are illustrated in the same manner.

First, depression and protrusion patterns 102 may be formed on the surface of the substrate 101. However, the depression and protrusion patterns 102 may be omitted according to exemplary embodiments. A substrate formed of a material such as sapphire, Si, SiC, $MgAl_2O_4$, MgO, $LiAlO_2$, $LiGaO_2$, or GaN as described above may be used as the substrate 101.

Next, a first conductivity-type semiconductor layer 110, an active layer 120, and a second conductivity-type semiconductor layer 130 may be sequentially grown on the substrate 101 using metal-organic chemical vapor deposition (MOCVD), hydride vapor phase epitaxy (HYPE), or molecular beam epitaxy (MBE) to form the light emitting structure 100 having a stacked structure of a plurality of semiconductor layers. Here, the first conductivity-type semiconductor layer 110 and the second conductivity-type semiconductor layer 130 may be an n-type semiconductor layer and a p-type semiconductor layer 130, respectively. In the light emitting structure 100, the positions of the first conductivity-type semiconductor layer 110 and the second conductivity-type semiconductor layer 130 may be interchanged, and the second conductivity-type semiconductor layer 130 may first be formed on the substrate 101.

Figure 6A:
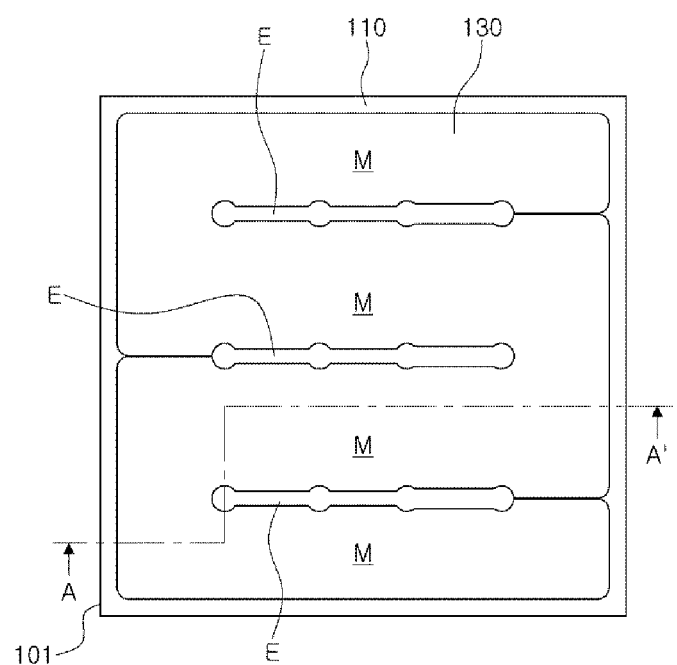

Referring to FIGS. 6A and 6B, portions of the second conductivity-type semiconductor layer 130, the active layer 120, and the first conductivity-type semiconductor layer 110 may be etched to expose at least a portion of the first conductivity-type semiconductor layer 110 (e.g., through the second conductivity-type semiconductor layer 130 and the active layer 120). Accordingly, etched regions E and a plurality of mesa regions M partially demarcated by the etched regions E may be formed.

During the etching process, a mask layer may be formed in a region excluding a region in which the first conductivity-type semiconductor layer 110 is exposed, and wet etching or dry etching may be subsequently performed to form the mesa regions M. According to exemplary embodiments, the etching process may be performed such that the first conductivity-type semiconductor layer 110 is not etched (e.g., the etching does not extend through the thickness of the first conductivity-type semiconductor layer 110) and only a portion of an upper surface thereof is exposed.

A first insulating layer 200a may be formed on lateral surfaces of the mesa region M exposed to the etched region E through the etching process. The first insulating layer 200a may be formed to cover the lateral surface of the mesa region M including an edge of an upper surface of the mesa region M and a portion of a bottom surface of the etched region E. Thus, the active layer 120 exposed to the etched region E may be covered by the first insulating layer 200a so as not to be exposed outwardly. However, the first insulating layer 200a is selectively formed and may be omitted according to exemplary embodiments.

Figure 7A:
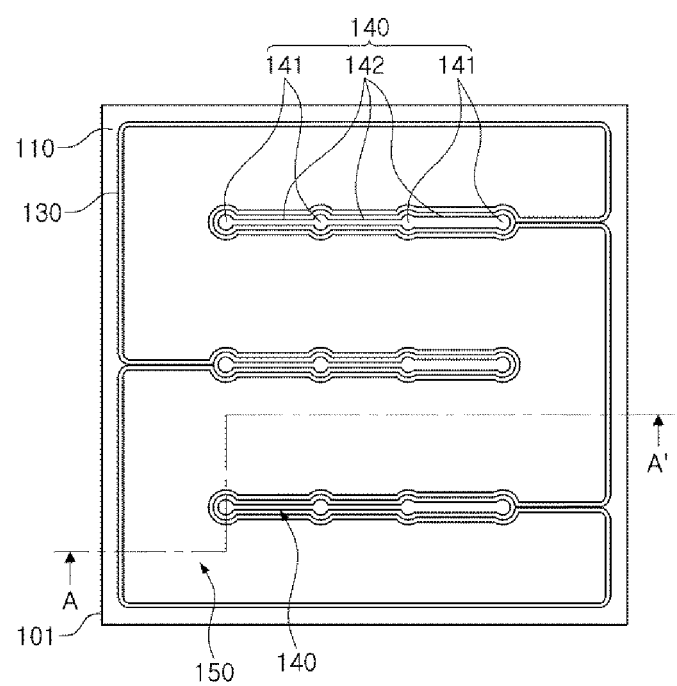
Figure 7B:
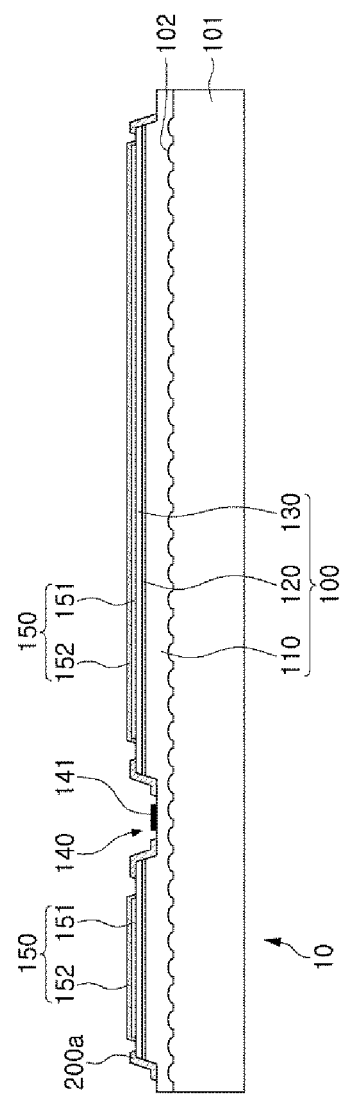

Referring to FIGS. 7A and 7B, a first electrode 140 and a second electrode 150 may be formed in the etched region E and the mesa region M, respectively. The first electrode 140 may extend along the etched region E and may be connected to the first conductivity-type semiconductor layer 110 defining a bottom surface of the etched region E. The second electrode 150 may be connected to the second conductivity-type semiconductor layer 130.

The first contact electrode 140 may include a plurality of pad portions 141 and a plurality of finger portions 142 extending from and between the pad portions 141. The second electrode 150 may include a reflective metal layer 151. The second electrode 150 may further include a coating metal layer 152 covering the reflective metal layer 151. When the first electrode 140 and the second electrode 150 are formed, an LED chip 10 is prepared.

Figure 8A:
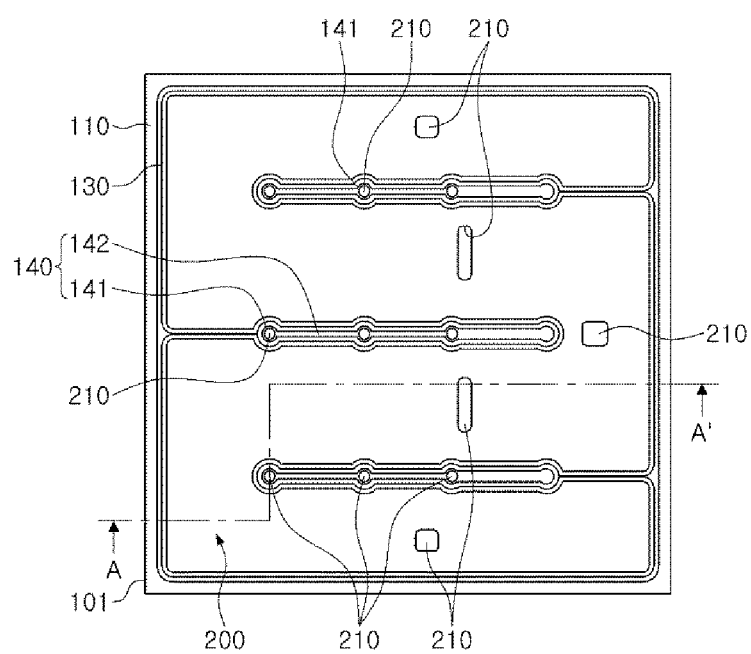
Figure 8B:
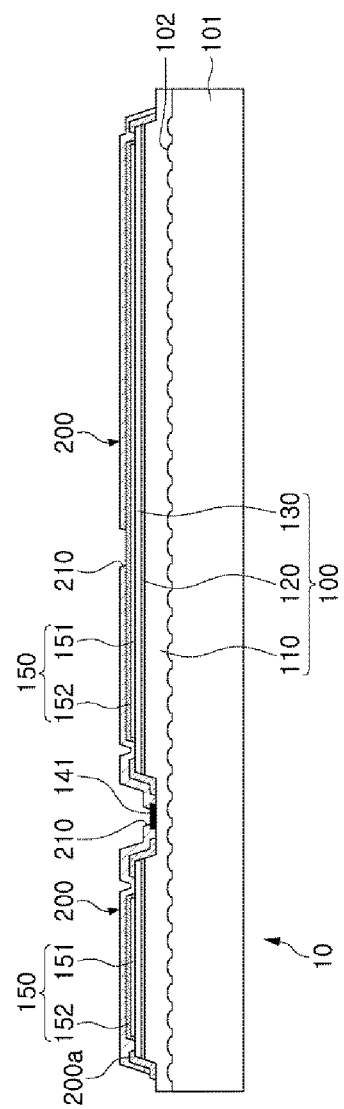

Referring to FIGS. 8A and 8B, a second insulating layer 200 may be provided to cover the surface of the LED chip 10. For example, the second insulating layer 200 may be formed of an epoxy-based insulating resin. Also, the second insulating layer 200 may include a silicon oxide or a silicon nitride and may be formed of, for example, $SiO_2$, SiN, $SiO_xN_y$, $TiO_2$, $Si_3N_4$, $Al_2O_3$, TiN, AlN, $ZrO_2$, TiAlN, or TiSiN.

The first electrode 140 and the second electrode 150 respectively disposed on the first and second conductivity-type semiconductor layers 110 and 130 may be partially exposed through the plurality of openings 210 formed in the second insulating layer 200.

Figure 9A:
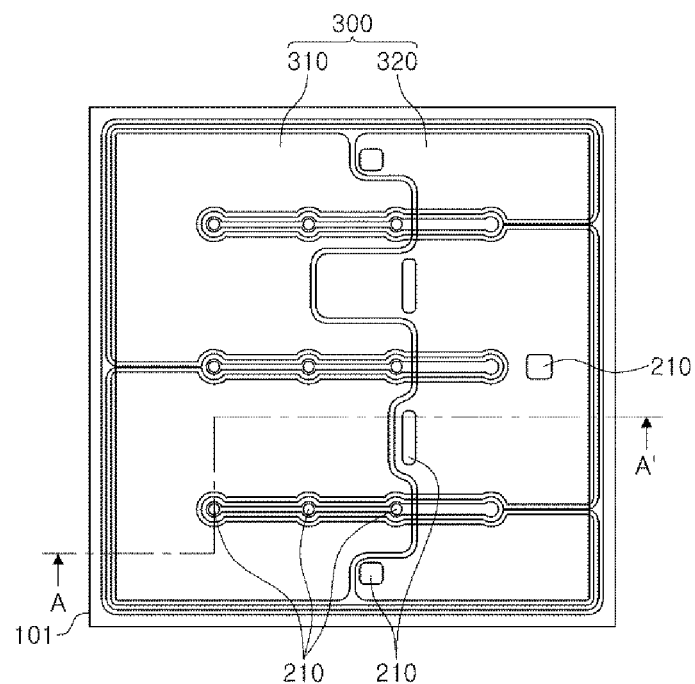
Figure 9B:
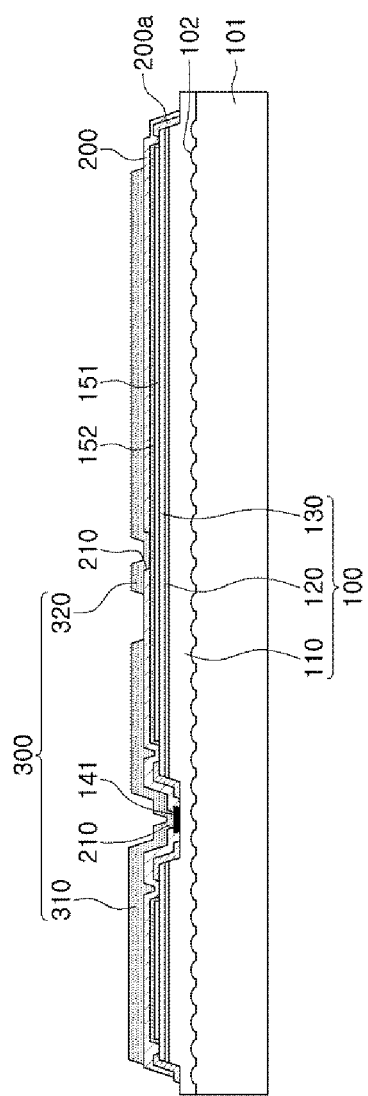

Referring to FIGS. 9A and 9B, a barrier metal layer 300 may be formed on the first insulating layer 200. The barrier metal layer 300 may be connected to the first and second electrodes 140 and 150 exposed through the openings 210 so as to be electrically connected to the first conductivity-type semiconductor layer 110 and the second conductivity-type semiconductor layer 130, respectively.

The barrier metal layer 300 may be provided as at least a pair of metal layers in order to electrically insulate the first conductivity-type semiconductor layer 110 and the second conductivity-type semiconductor layer 130 from each other. Namely, a first metal layer 310 is electrically connected to the first conductivity-type semiconductor layer 110 through the first electrode 140, a second metal layer 320 may be electrically connected to the second conductivity-type semiconductor layer 130 through the second electrode 150, and the first and second metal layers 310 and 320 may be separated from each other to be electrically insulated from each other.

Figure 10A:
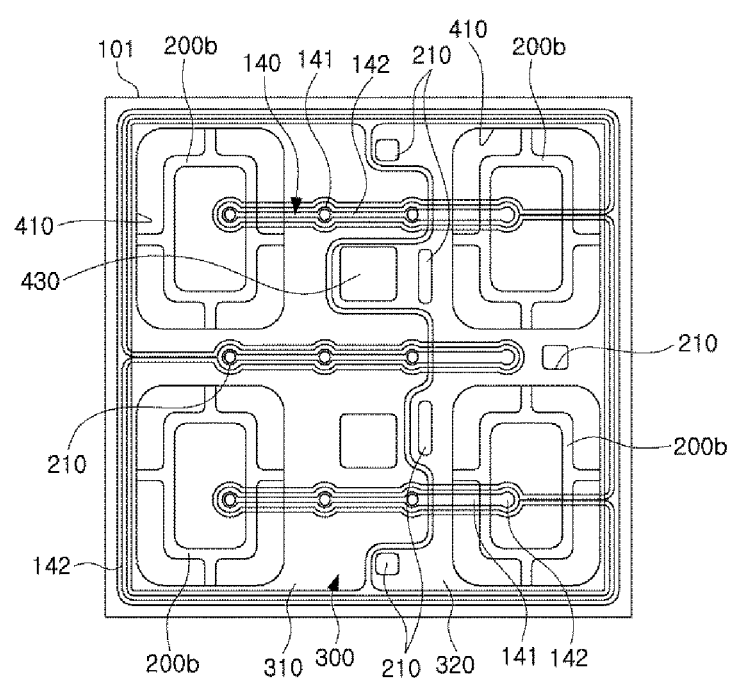
Figure 10B:
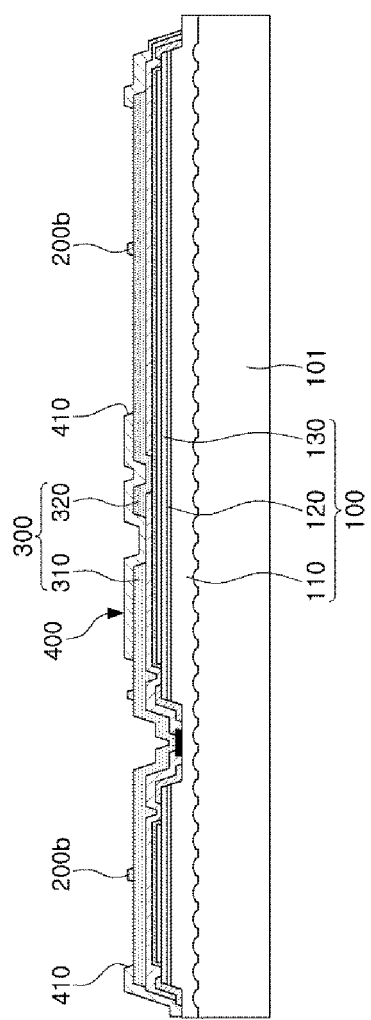

Referring to FIGS. 10A and 10B, a passivation layer 400 may be formed on the barrier metal layer 300. The passivation layer 400 may partially expose the barrier metal layer 300 through a bonding region 410.

A plurality of bonding regions 410 may be provided to partially expose the first metal layer 310 and the second metal layer 320, respectively. In this case, a portion of the plurality of bonding regions 410 may be disposed not to overlap the plurality of openings 210 of the second insulating layer 200. For example, as illustrated in FIG. 10A, the bonding region 410 partially exposing the second metal layer 320, among the plurality of bonding regions 410, may not overlap with the opening 210 partially exposing the second electrode 150, among the plurality of openings 210. Namely, the bonding region 410 is not positioned above the opening 210 in a vertical direction (e.g., corresponding to a stacking direction of the light emitting structure).

The passivation layer 400 may be formed of the same material as that of the second insulating layer 200.

Also, as illustrated in FIG. 10A, the passivation layer 400 may further include open regions 430 partially exposing the first and second metal layers 310 and 320, like the bonding region 410. The open regions 430 serve to allow for determining operability of a manufactured semiconductor light emitting device before a product containing the same is released. In this case, an operation of the semiconductor light emitting device may be determined by connecting probe pins (not shown) to the first and second metal layers 310 and 320 exposed to the open regions 430 and supplying driving power thereto.

Here, a crack blocking layer 200b may be formed in a region of the bonding region 410 in which the solder pad 500 is not to be disposed, namely, in a region to become an isolation region, during a follow-up process. The crack blocking layer 200b may be formed of the same material as that of the passivation layer 400, and may be formed simultaneously when the passivation layer 400 is formed.

Referring to FIGS. 1 and 2, a solder pad 500 including a first solder pad 510 and a second solder pad 520 may be formed on the first and second metal layers 310 and 320 partially exposed through the bonding region 410. The first solder pad 510 and the second solder pad 520 may be, for example, under-bump metallurgy (UBM) layers. The number and dispositional structure and pattern of the first solder pad 510 and the second solder pad 520 may not be limited to those illustrated and may be variously modified as described above.

Figure 11A:
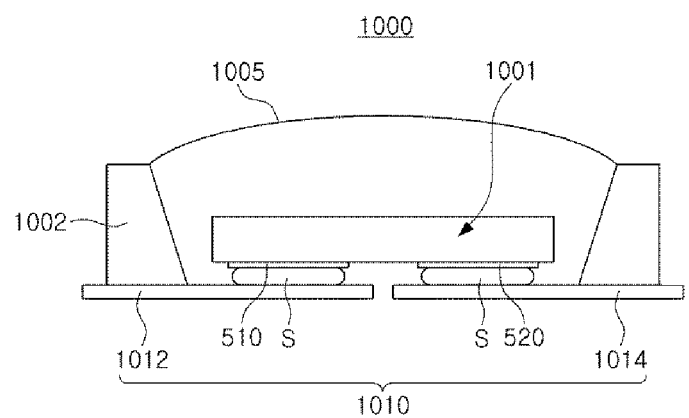
FIGS. 11A and 11B are cross-sectional views schematically illustrating examples of a semiconductor light emitting device package including a semiconductor light emitting device package according to an exemplary embodiment in the present disclosure.
Figure 11B:
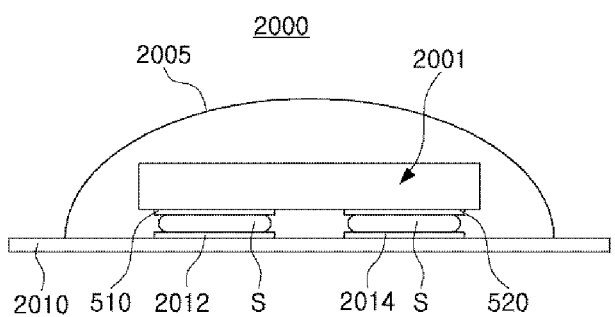

FIGS. 11A and 11B are cross-sectional views schematically illustrating examples of semiconductor light emitting device packages including a semiconductor light emitting device according to an exemplary embodiment of the present disclosure.

Referring to FIG. 11A, a semiconductor light emitting device package 1000 may include a semiconductor light emitting device 1001 as a light source, a package body 1002, a pair of lead frames 1010, and an encapsulant 1005. The semiconductor light emitting device 1001 may be the semiconductor light emitting device 1 of FIG. 1 and a detailed description thereof will be omitted.

The semiconductor light emitting device 1001 may be mounted on the lead frames 1010 and electrically connected to the lead frames 1010 through a conductive bonding material. As the conductive bonding material, for example, solder bumps S including Sn may be used.

The pair of lead frames 1010 may include a first lead frame 1012 and a second lead frame 1014. Referring to FIG. 11A, the first solder pad 510 and the second solder pad 520 of the semiconductor light emitting device 1001 may be connected to the first lead frame 1012 and the second lead frame 1014, respectively, through the solder bumps S interposed between the semiconductor light emitting device 1001 and the pair of lead frames 1010.

The package body 1002 may have a reflective cup to enhance light reflection efficiency and light extraction efficiency. The encapsulant 1005 formed of a light-transmissive material may be formed in the reflective cup to encapsulate the semiconductor light emitting device 1001.

Referring to FIG. 11B, a semiconductor light emitting device package 2000 may include a semiconductor light emitting device 2001, a mounting board 2010, and an encapsulant 2005. The semiconductor light emitting device 2001 may be the semiconductor light emitting device 1 of FIG. 1 and a detailed description thereof will be omitted.

The semiconductor light emitting device 2001 may be mounted on the mounting board 2010 and electrically connected to first and second circuit patterns 2012 and 2014. The first solder pad 510 and the second solder pad 520 of the semiconductor light emitting device 2001 may be connected to the first second circuit pattern 2012 and second circuit pattern 2014, respectively, through the solder bumps S interposed between the semiconductor light emitting device 2001 and the first and second circuit patterns 2012 and 2014.

The semiconductor light emitting device 2001 may be encapsulated by the encapsulant 2005. In this manner, a chip-on-board (COB) type package structure may be obtained.

The mounting board 2010 may be provided as a printed circuit board (PCB), metal-core printed circuit board (MCPCB), a metal printed circuit board (MPCB), a flexible printed circuit board (FPCB), or the like, and a structure of the mounting board 2010 may be applied in various forms.

Figure 12:
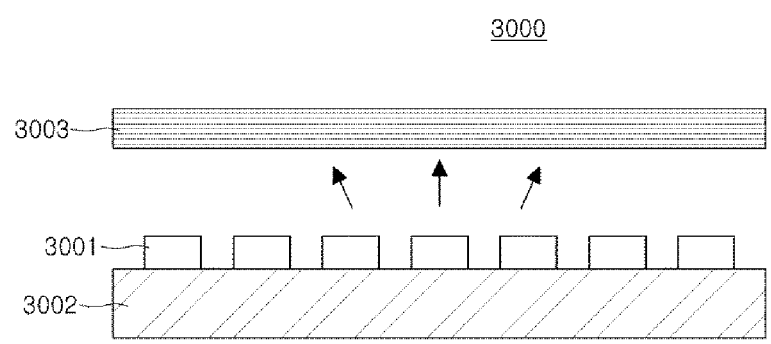
FIGS. 12 and 13 are cross-sectional views illustrating examples of a backlight unit including a semiconductor light emitting device package according to an exemplary embodiment in the present disclosure.
Figure 13:
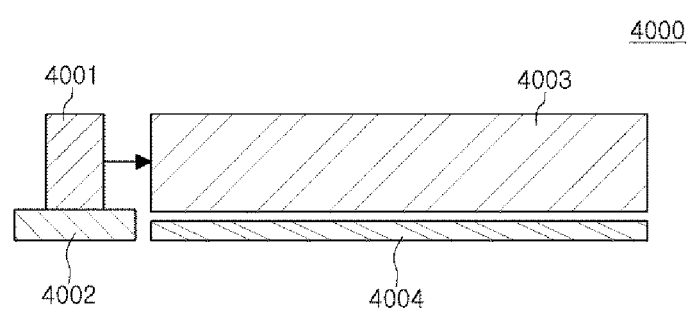

FIGS. 12 and 13 are cross-sectional views illustrating examples of backlight units including a semiconductor light emitting device according to an exemplary embodiment of the present disclosure.

Referring to FIG. 12, a backlight unit 3000 includes light sources 3001 mounted on a board 3002 and one or more optical sheets 3003 disposed above the light sources 3001. A semiconductor light emitting device package having the structure described above with reference to FIGS. 11A and 11B or a structure similar thereto may be used as the light sources 3001. Alternatively, a semiconductor light emitting device may be directly mounted on the board 3002 (a so-called COB type mounting scheme) and used as the light source.

Unlike the backlight unit 3000 in FIG. 12 in which the light sources 3001 emit light toward an upper side where a liquid crystal display is disposed, a backlight unit 4000 as another example illustrated in FIG. 13 is configured such that a light source 4001 mounted on a board 4002 emits light in a lateral direction, and the emitted light may be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 14:
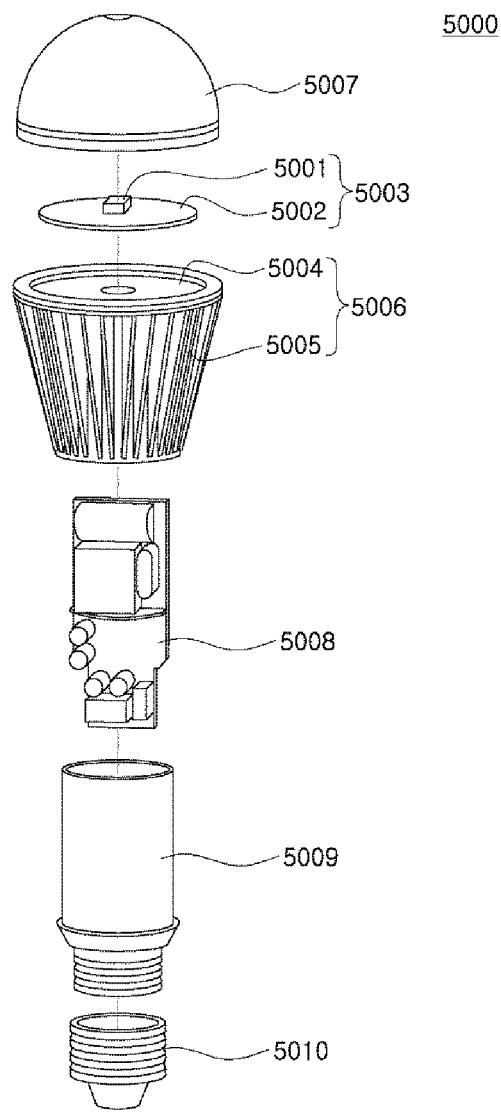
FIGS. 14 and 15 are exploded perspective views illustrating examples of a lighting device including a semiconductor light emitting device package according to an exemplary embodiment in the present disclosure.
Figure 15:
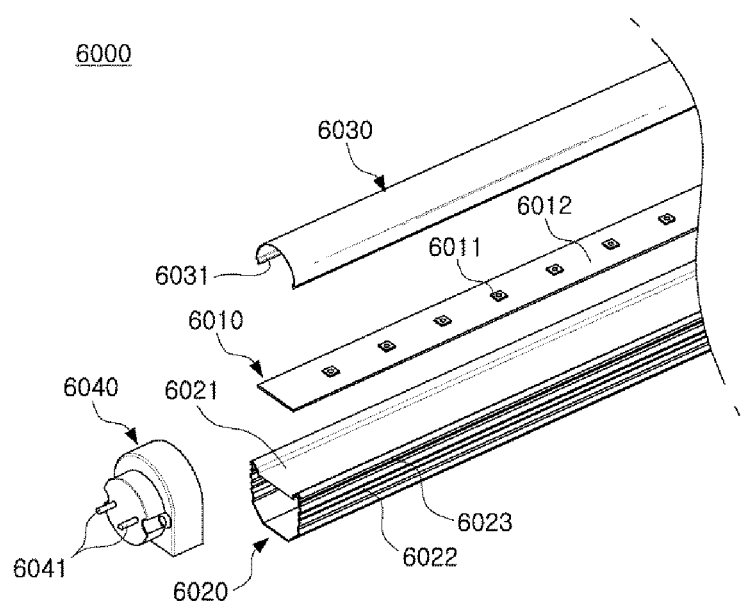

FIGS. 14 and 15 are exploded perspective views illustrating examples of lighting devices including a semiconductor light emitting device according to an exemplary embodiment of the present disclosure.

FIG. 14 is an exploded perspective view illustrating an example of a lighting device including a nanostructure semiconductor light emitting device according to an exemplary embodiment in the present disclosure.

A lighting device 5000 illustrated in FIG. 14 is exemplified as a bulb-type lamp, and may include a light emitting module 5003, a driver 5008, and an external connector 5010.

Also, the lighting device 5000 may further include exterior structures such as an external housing 5006, an internal housing 5009, and a cover 5007. The light emitting module 5003 may include a semiconductor light emitting device 5001 having a structure the same as or similar to that of the LED chip 1 of FIGS. 1-3 and a circuit board 5002 on which the semiconductor light emitting device 5001 is mounted.

For example, the first and the second electrodes of the above-described semiconductor light emitting device may be electrically connected to electrode patterns of the circuit board 5002. According to this exemplary embodiment, a single light source is mounted on the circuit board 5002 by way of example; however, a plurality of light sources may be mounted on the circuit board, if necessary.

The external housing 5006 may serve as a heat radiator, and may include a heat sink plate 5004 directly contacting the light emitting module 5003 to thereby improve heat dissipation and heat radiating fins 5005 surrounding a side surface of the lighting device 5000. The cover 5007 may be disposed above the lighting module 5003 and may have a convex lens shape. The driver 5008 may be disposed inside the internal housing 5009 and be connected to the external connector 5010 such as a socket structure to receive power from an external power source. Also, the driver 5008 may convert the received power into power appropriate for driving the light source 5001 of the lighting module 5003 and supply the converted power thereto. For example, the driver 5008 may be provided as an AC-DC converter, a rectifying circuit, or the like.

Also, although not shown, the lighting device 5000 may further include a communications module.

Referring to FIG. 15, a lighting device 6000 is a bar-type lamp, for example, and may include a light emitting module 6010, a body unit 6020, a cover unit 6030, and a terminal unit 6040.

The light emitting module 6010 may include a board 6012 and a plurality of semiconductor light emitting devices 6011 mounted on the board 6012. As the semiconductor light emitting devices 6011, the semiconductor light emitting device 1 illustrated in FIG. 1 or the semiconductor light emitting device packages 1000 and 2000 illustrated in FIGS. 11A and 11B may be used.

The body unit 6020 may allow the light emitting module 6010 to be fixedly mounted on one surface thereof by means of a recess 6021, and dissipate heat generated by the light emitting module 6010 outwardly. Thus, the body unit 6020 may include a heat sink as a support structure and have a plurality of heat dissipation fins 6022 protruding from both lateral surfaces thereof in order to perform heat dissipation.

The cover unit 6030 may be fastened to a stopping recess 6023 of the body unit 6020 and may have a semi-circular curved surface to allow light to be evenly irradiated outwardly. A protrusion 6031 may be formed on a bottom surface of the cover unit 6030 in a length direction and engaged with the stopping recess 6023 of the body unit 6020.

The terminal unit 6040 may be provided to at least one open end portion among both end portions of the body unit 6020 in the length direction and supply power to the light emitting module 6010 and may include electrode pins 6041 protruding outwardly.

As set forth above, according to exemplary embodiments of the present disclosure, a semiconductor light emitting device capable of preventing an interface between a solder pad and a solder bump from being damaged and/or separated and a semiconductor light emitting device package having the same may be provided.

While exemplary embodiments have been shown and described above, it will be apparent to those skilled in the art that modifications and variations could be made without departing from the scope of the present invention as defined by the appended claims.

What is claimed is:

1. A semiconductor light emitting device comprising:
    a light emitting diode (LED) chip having a first surface on which first and second electrodes are disposed and a second surface opposing the first surface;
    a passivation layer disposed on a surface of the LED chip such that bonding regions of the first and second electrodes are exposed through the passivation layer;
    a plurality of solder pads, each solder pad disposed in a respective bonding region of the bonding regions and having a plurality of separated regions; and
    a plurality of solder bumps, each solder bump disposed in a respective bonding region of the bonding regions and covering the plurality of separated regions of the solder pad disposed in the respective bonding region.

2. The semiconductor light emitting device of claim 1, wherein the plurality of separated regions of each solder pad are separated and spaced apart from each other by an isolation region forming a predetermined gap between the separated regions.

3. The semiconductor light emitting device of claim 2, wherein a width of the isolation region is smaller than a width of one of the plurality of separated regions.

4. The semiconductor light emitting device of claim 2, wherein the isolation region has a band shape surrounding one of the plurality of separated regions of the solder pads.

5. The semiconductor light emitting device of claim 2, further comprising:
    a crack blocking layer disposed in each isolation region.

6. The semiconductor light emitting device of claim 5, wherein the crack blocking layer has a material composition that is the same as the material composition of the passivation layer.

7. The semiconductor light emitting device of claim 5, wherein the crack blocking layer includes an insulating material including at least one of $SiO_2$, SiN, $SiO_xN_y$, $TiO_2$, $Si_3N_4$, $Al_2O_3$, TiN, AlN, $ZrO_2$, TiAlN and TiSiN.

8. The semiconductor light emitting device of claim 1, further comprising:
    an inter-metallic compound layer disposed on a surface of each solder pad with which a solder bump is in contact.

9. The semiconductor light emitting device of claim 8, wherein the inter-metallic compound layer includes separated regions each corresponding to one of the plurality of separated regions of each solder pad.

10. The semiconductor light emitting device of claim 8, wherein the inter-metallic compound layer is formed of an Sn-Ni alloy.

11. The semiconductor light emitting device of claim 1, further comprising:
    a barrier metal layer disposed between the solder pads and the first and second electrodes.

12. The semiconductor light emitting device of claim 11, further comprising:
    an insulating layer, having openings partially exposing the first and second electrodes, and disposed between the barrier metal layer and the first and second electrodes.

13. A semiconductor light emitting device package comprising:
    a package body including first and second lead frames; and
    a semiconductor light emitting device connected to the first and second lead frames through solder bumps interposed between the semiconductor light emitting device and the first and second lead frames of the package body, wherein the semiconductor light emitting device comprises:
a light emitting structure including a first conductivity-type semiconductor layer, an active layer, and a second conductivity-type semiconductor layer; and
a solder pad electrically connected to one of the first and second conductivity-type semiconductor layers and disposed in a bonding region,
wherein the bonding region has an area recessed from the circumference thereof that is free of the solder pad, and one of the solder bumps is disposed in the bonding region to cover the solder pad and the area recessed from the circumference.

14. The semiconductor light emitting device package of claim 13, wherein a crack blocking layer is disposed in the recessed area.

15. The semiconductor light emitting device package of claim 13, wherein an inter-metallic compound layer is formed on a surface of the solder pad with which the solder bump is in contact.

16. An integrated circuit chip comprising:
a substrate;
at least one electronic component disposed on the substrate; and
a solder pad disposed on the substrate and comprising:
a first solder pad region configured for soldering to a solder bump; and
a second solder pad region spaced apart from the first solder pad region, electrically connected to a same terminal of the at least one electronic component as the first solder pad region, and configured for soldering to the same solder bump as the first solder pad region.

17. The integrated circuit chip of claim 16, further comprising:
an insulating material layer disposed in a space between the first and second solder pad regions.

18. The integrated circuit chip of claim 17, further comprising:
a passivation layer surrounding the solder pad,
wherein the passivation layer and the insulating material layer are formed of a same insulating material.

19. The integrated circuit chip of claim 16, further comprising:
an insulating layer overlaying the at least one electronic component,
wherein the solder pad is disposed on a portion of the insulating layer overlaying the at least one electronic component.

20. The integrated circuit chip of claim 16, wherein a circumferential edge of the first solder pad region includes a concave portion.

* * * * *